United States Patent
Long et al.

(10) Patent No.: US 11,175,549 B2
(45) Date of Patent: Nov. 16, 2021

(54) DISPLAY SUBSTRATE, DISPLAY PANEL AND DISPLAY DEVICE

(71) Applicant: BOE Technology Group Co., Ltd., Beijing (CN)

(72) Inventors: Chunping Long, Beijing (CN); Yongda Ma, Beijing (CN); Jian Xu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 354 days.

(21) Appl. No.: 16/326,474

(22) PCT Filed: May 22, 2018

(86) PCT No.: PCT/CN2018/087886
§ 371 (c)(1),
(2) Date: Feb. 19, 2019

(87) PCT Pub. No.: WO2019/033812
PCT Pub. Date: Feb. 21, 2019

(65) Prior Publication Data
US 2021/0173271 A1    Jun. 10, 2021

(30) Foreign Application Priority Data
Aug. 18, 2017  (CN) .......................... 201710713098.9

(51) Int. Cl.
*G02F 1/1368* (2006.01)
*G02F 1/1362* (2006.01)
*H01L 27/12* (2006.01)

(52) U.S. Cl.
CPC ...... *G02F 1/136286* (2013.01); *G02F 1/1368* (2013.01); *G02F 1/13624* (2013.01);
(Continued)

(58) Field of Classification Search
CPC ................................................ G02F 1/136286
See application file for complete search history.

(56) References Cited

U.S. PATENT DOCUMENTS

2002/0003588 A1  1/2002  Okada et al.
2004/0017521 A1  1/2004  Okada et al.
(Continued)

FOREIGN PATENT DOCUMENTS

| CN | 1932591 A | 3/2007 |
| CN | 101868756 A | 10/2010 |
| CN | 107272292 A | 10/2017 |

OTHER PUBLICATIONS

Office Action for corresponding Chinese Application 201710713098.9 dated Apr. 28, 2019.
(Continued)

*Primary Examiner* — Sang V Nguyen
(74) *Attorney, Agent, or Firm* — Arent Fox LLP; Michael Fainberg (57) ABSTRACT

Disclosed are a display substrate, a display panel, a display device. The display substrate includes pixel units on a substrate in form of array, gate lines in one-to-one correspondence to each row of pixel units, data lines between any two adjacent columns of pixel units and on sides, far away from the substrate, of gate lines, each pixel unit includes a pixel electrode, a thin film transistor configured to control the pixel electrode; each data line includes curved data line parts between any two pixel units, whose row directions are adjacent to each other, in two columns of pixel units on two sides of data line; each data line part includes a first part covered by a pixel electrode of pixel unit on one side of the data line part, a second part covered by a pixel electrode of pixel unit on the other side of the data line part.

11 Claims, 4 Drawing Sheets

(52) U.S. Cl.
CPC ...... *G02F 1/136213* (2013.01); *H01L 27/124* (2013.01); *H01L 27/1255* (2013.01)

(56) References Cited

U.S. PATENT DOCUMENTS

| | | | | |
|---|---|---|---|---|
| 2007/0109482 | A1* | 5/2007 | Kim | G02F 1/133707 349/144 |
| 2010/0277447 | A1 | 11/2010 | Itoh et al. | |
| 2011/0181805 | A1* | 7/2011 | Nagami | G02F 1/136209 349/43 |
| 2012/0252152 | A1* | 10/2012 | Hong | G02F 1/13624 438/34 |
| 2016/0147119 | A1* | 5/2016 | Chang | G02F 1/134336 349/33 |
| 2016/0202586 | A1* | 7/2016 | Chang | G02F 1/13394 257/72 |
| 2018/0239207 | A1* | 8/2018 | Ying | G09G 3/3659 |

OTHER PUBLICATIONS

International Search Report for PCT/CN2018/087886 dated Sep. 5, 2018.

\* cited by examiner

DISPLAY SUBSTRATE, DISPLAY PANEL AND DISPLAY DEVICE

This application is a National Stage of International Application No. PCT/CN2018/087886, filed on May 22, 2018, which claims priority of Chinese Patent Application No. 201710713098.9, filed with the Chinese Patent Office on Aug. 18, 2017 and entitled "DISPLAY SUBSTRATE, DISPLAY PANEL AND DISPLAY DEVICE", both of which are incorporated herein by reference in their entireties.

FIELD

The present disclosure relates to the technical field of display, in particular, to a display substrate, a display panel and a display device.

BACKGROUND

In a panel display device, a thin film transistor liquid crystal display (TFT-LCD) having the characteristics of small size, zero radiation, and relatively low manufacture cost occupies a leading position in the current panel display market.

A liquid crystal display panel of the TFT-LCD structurally comprises an array substrate, a color filter substrate, and liquid crystals, wherein a paired structure defined by the array substrate and the color filter substrate is filled with the liquid crystals; a plurality of gate lines and a plurality of data lines are formed on the array substrate; the gate lines and the data lines are arranged in a crossed manner to define a plurality of pixel units that are arranged in an array; each pixel unit includes a pixel electrode and a thin film transistor (TFT for short) configured to control the pixel electrode; color resists are respectively arranged at positions, corresponding to the pixel units, on the color filter substrate; and to avoid light leakage, black matrixes are arranged at positions, corresponding the gate lines and the data lines, on the color filter substrate. Therefore, the aperture ratio of the display device is reduced undoubtedly. To improve the aperture ratio, during the production of an array substrate in the related art, a pixel electrode may cover a data line to form a modulation electric field, so that liquid crystal molecules at positions, corresponding to a data line, in a liquid crystal layer can deflect in a specified direction, and then, light leakage can be avoided.

SUMMARY

An embodiment of the present disclosure provides a display substrate, including a substrate, a plurality of pixel units on the substrate in the form of an array, gate lines that are in one-to-one correspondence to each row of pixel units, and data lines located between any two adjacent columns of pixel units, wherein each of the pixel units includes a pixel electrode and a thin film transistor configured to control the pixel electrode; and each of the data lines includes a plurality of curved data line parts between any two pixel units, whose row directions are adjacent to each other, in two columns of pixel units on two sides of the data line, wherein each data line part includes a first part covered by a pixel electrode of a pixel unit on one side of the data line part and a second part covered by a pixel electrode of a pixel unit on the other side of the data line part.

Optionally, each data line part further includes a connection part configured to connect the first part with the second part.

Optionally, the first part, the connection part and the second part are single lines, and each data line part includes a first part, a connection part, and a second part that are connected sequentially.

Optionally, the pixel units are defined by a plurality of gate lines and a plurality of data lines that cross each other; each pixel unit includes a thin film transistor; a gate of the thin film transistor is connected to a gate line corresponding to the pixel unit; a source of the thin film transistor is connected to a data line part covered by a pixel electrode of the pixel unit; and a drain of the thin film transistor is connected to the pixel electrode of the pixel unit.

Optionally, the display substrate further includes a plurality of common electrode lines arranged on a layer same as a layer where the gate lines are; each common electrode line is between two adjacent gate lines; for a pixel unit and a common electrode line between any two adjacent gate lines, a pixel electrode of the pixel unit covers the common electrode line; and for each pixel unit, the common electrode line is a bottom electrode of a storage capacitor of the pixel unit, and the pixel electrode is a top electrode of the storage capacitor of the pixel unit.

Optionally, the first part includes a first line segment and a second line segment; the second part is a single line; the connection part includes a first connection part and a second connection part; each data line part includes a first line segment, a first connection part, a second part, a second connection part and a second line segment that are connected sequentially.

Optionally, each gate line passes through a pixel area of each pixel unit in a row of pixel units corresponding to the gate line; the pixel area of each pixel unit is divided into a first sub-pixel area and a second sub-pixel area; and the pixel electrode includes a first sub-pixel electrode and a second sub-pixel electrode that correspond to the first sub-pixel area and the second sub-pixel area respectively.

Optionally, the first sub-pixel electrode and the second sub-pixel electrode adopt an integral structure covering the gate line; and each pixel unit includes two thin film transistors, wherein gates of the two thin film transistors are connected to gate lines corresponding to the pixel unit; sources of the two thin film transistors are respectively connected to data line parts covered by pixel electrodes of the pixel unit; and drains of the two thin film transistors are respectively connected to the first sub-pixel electrode and the second sub-pixel electrode.

Optionally, for each pixel unit, the gate line is a bottom electrode of a storage capacitor of the pixel unit, and the pixel electrode is a top electrode of the storage capacitor of the pixel unit.

Optionally, the first sub-pixel electrode and the second sub-pixel electrode are on two sides of the gate line in an insulated manner; and each pixel unit includes two thin film transistors, wherein gates of the two thin film transistors are connected to gate lines corresponding to the pixel unit; sources of the two thin film transistors are respectively connected to data line parts covered by pixel electrodes of the pixel unit; and drains of the two thin film transistors are respectively connected to the first sub-pixel electrode and the second sub-pixel electrode.

Optionally, the display substrate further includes a group of common electrode lines arranged on a layer same as a layer where the gate line is; the group of common electrode lines includes a plurality of first common electrode lines;

and the pixel units are defined by the plurality of first common electrode lines and a plurality of data lines that cross each other.

Optionally, for a pixel unit between any two adjacent first common electrode lines, pixel electrodes of the pixel unit respectively cover side parts, near the pixel unit, of the two first common electrode lines; and for each pixel unit, the side parts of the two first common electrode lines are bottom electrodes of a storage capacitor of the pixel unit, and the pixel electrodes are top electrodes of the storage capacitor of the pixel unit.

Optionally, the group of common electrode lines further includes a plurality of second common electrode lines; each second common electrode line is between a first common electrode line and a gate line that are adjacent to each other; and for a pixel unit between any two adjacent first common electrode lines, the first sub-pixel electrode and the second sub-pixel electrode of the pixel unit respectively cover corresponding second common electrode lines; and the display substrate further includes a metal wiring arranged on a layer same as a layer where the drain of the thin film transistor is, and connected with the drain through a drain lead; the metal wiring is located above the second common electrode line; and for each pixel unit, the second common electrode line is a bottom electrode of a storage capacitor of the pixel unit, and the metal wiring is a top electrode of the storage capacitor of the pixel unit.

Some embodiments of the present disclosure further provide a display panel, including the display substrate according to any one of the foregoing technical solutions.

Some embodiments of the present disclosure further provide a display device, including the display panel according to the foregoing technical solution.

DETAILED DESCRIPTION OF THE EMBODIMENTS

To improve an aperture ratio of a display device and improve a display quality of the display device, embodiments of the present disclosure provide a display substrate, a display panel and a display device. To make the objectives, technical solutions and advantages of the present disclosure clearer, the present disclosure is further described in details by using embodiment examples as follows.

Figure 1:
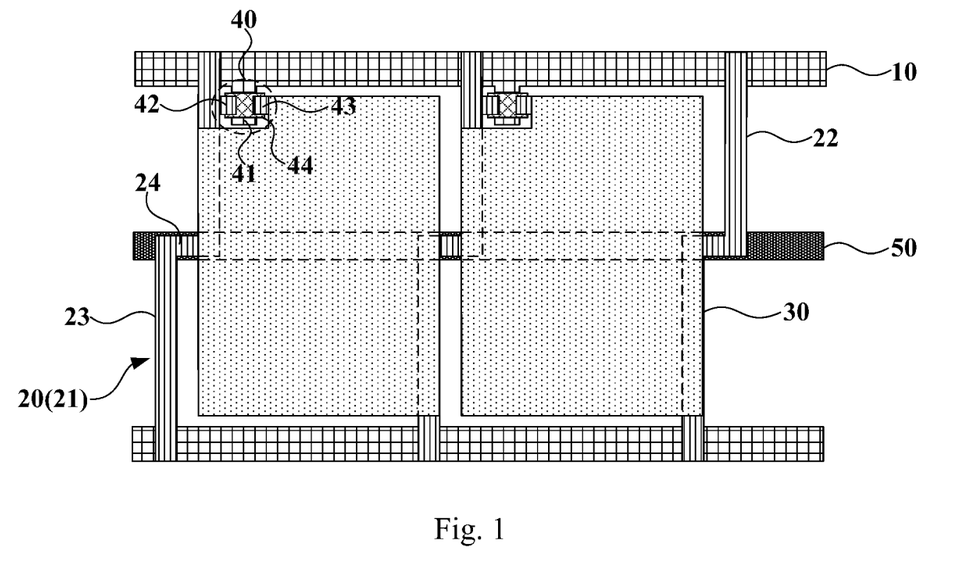
FIG. 1 is a schematic diagram of a local structure of a display substrate according to an embodiment of the present disclosure.

As shown in FIG. 1, an embodiment of the present disclosure provide a display substrate, including a substrate, a plurality of pixel units located on the substrate in the form of an array, gate lines 10 that are in one-to-one correspondence to each row of pixel units, and data lines 20 located between any two adjacent columns of pixel units, wherein, each pixel unit includes a pixel electrode 30 and a thin film transistor 40 configured to control the pixel electrode 30; and each data line 20 includes a plurality of curved data line parts 21 between any two pixel units, whose row directions are adjacent to each other, in two columns of pixel units on two sides of the data line 20, wherein each data line part 21 includes a first part 22 covered by a pixel electrode 30 of a pixel unit on one side of the data line part 21 and a second part 23 covered by a pixel electrode 30 of a pixel unit on the other side of the data line part 21.

The specific material of the substrate is not limited. For example, the material may be glass, resin, plastic, or the like. The specific materials of the gate line 10 and the data line 20 are not limited. For example, the materials may include copper Cu, aluminum Al, molybdenum Mo, titanium Ti, chromium Cr, tungsten W, neodymium Nd or niobium Nb. The gate line 10 and the data line 20 may adopt single-layer structures or multi-layer structures. When adopting multi-layer structures, the gate line 10 and the data line 20 may be made of Mo\Al\Mo, Ti\Al\Ti, Ti\Cu\Ti, Mo\Cu\Ti, or the like. The widths of the gate line 10 and the data line 20 are not limited. In this embodiment of the present disclosure, the width of the gate line 10 ranges from 2 microns to 50 microns, and the width of the data line 20 ranges from 2 microns to 20 microns. The specific material of the pixel electrode 30 is not limited. For example, the material may be an indium-tin oxide ITO, an indium-zinc oxide IZO, an indium-tin-zinc oxide ITZO, or other transparent metallic oxide.

According to the technical solution of some embodiments of the present disclosure, the first part 22 and the second part 23 of each data line part 21 are respectively covered by the pixel electrodes 30 of the pixel units on two sides. For the entire display substrate, except the connection parts 24, most of the data lines 20 are covered by the pixel electrodes 30 to form a modulation electric field, so that liquid crystal molecules at positions, corresponding to a coverage area, in a liquid crystal layer can deflect in a specified direction, that is, light leakage can be avoided without arranging a black matrix at a position, corresponding to the coverage area, on the display device, and the aperture ratio of the display device is improved. In addition, for each pixel unit, the pixel electrodes 30 of the pixel unit respectively cover a first part 22 of a data line part 21 on one side of the pixel unit and a second part 23 of a data line part 21 on the other side of the pixel unit. In this way, the pixel electrodes 30 and the data line parts 21 on two sides separately generate parasitic capacitance. Because voltage signals of two adjacent data lines 20 change in opposite directions, effects of the parasitic capacitance can cancel out each other. Compared with the related art, this solution also reduces crosstalk caused by parasitic capacitance, and improves the display quality of the display device.

A specific connection mode of the first part 22 and the second part 23 is not limited. In this embodiment of the present disclosure, each data line part 21 further includes a connection part 24 configured to connect the first part 22 with the second part 23.

Figure 2:
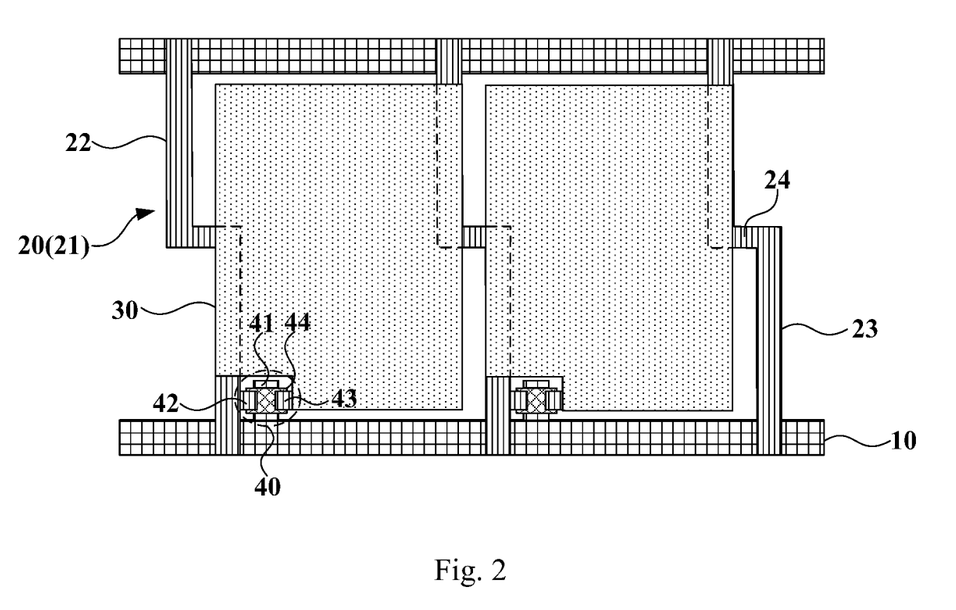
FIG. 2 is a schematic diagram of a local structure of a display substrate according to another embodiment of the present disclosure.

In a specific embodiment of the present disclosure, the first part 22, the connection part 24, and the second part 23 are single lines, and each data line part 21 includes a first part 22, a connection part 24 and a second part 23 that are connected sequentially. In this embodiment of the present disclosure, the single line may be understood as a single flat line segment. In this case, each data line part 21 includes a first part 22, a connection part 24, and a second part 23 that are three straight line segments; the first part 22 and the second part 23 may be parallel to each other; the bent shape of the data line part 21 is not limited. In an embodiment shown in FIG. 1, pixel electrodes 30 of a pixel unit respectively cover a first part 22 of a data line part 21 on the left side of the pixel unit and a second part 23 of a data line part 21 on the right side of the pixel unit. In an embodiment shown in FIG. 2, pixel electrodes 30 of a pixel unit respectively cover a second part 23 of a data line part 21 on the left side of the pixel unit and a first part 22 of a data line part 21 on the right side of the pixel unit. In addition, optionally, lengths of the first part 22 and the second part 23 are the same. Therefore, crosstalk caused by parasitic capacitance can be further reduced, and the display quality of the display device can be further improved.

A person skilled in the art may know that the thin film transistor 40 includes a gate 41 formed on the substrate, a gate insulating layer (not shown) formed on the gate 41, an active layer 44 formed on the gate insulating layer, and a source 42 and a drain 43 that are separately connected to the active layer 44. The specific material of the active layer 44 is not limited. For example, the material may be amorphous silicon, polycrystalline silicon, an oxide semiconductor, or the like. The specific material of the gate insulating layer is not limited. For example, the material may be silicon nitride, silicon oxide, or the like. The gate insulating layer may adopt a single-layer structure or a multi-layer structure. When adopting a multi-layer structure, the gate insulating layer may be made of silicon oxide/silicon nitride.

In an optional embodiment of the present disclosure, the pixel units are defined by a plurality of gate lines 10 and a plurality of data lines 20 that cross each other; each pixel unit includes a thin film transistor 40; a gate 41 of the thin film transistor 40 is connected to a gate line 10 corresponding to the pixel unit; a source 42 of the thin film transistor 40 is connected to a data line part 21 covered by a pixel electrode 30 of the pixel unit; and a drain 43 of the thin film transistor 40 is connected to the pixel electrode 30 of the pixel unit. In this case, the source 42 of the thin film transistor 40 may be connected to a first part 22 of a data line part 21 that is located on one side of the pixel unit and that is covered by the pixel electrode 30 of the pixel unit, or may be connected to a second part 23 of a data line part 21 that is located on the other side of the pixel unit and that is covered by a pixel electrode 30 of the pixel unit. It should be noted that the display substrate further includes a passivation layer or an organic material planarization layer formed on the thin film transistor 40. The drains 43 of the thin film transistors 40 may be connected to the pixel electrodes 30 through via holes formed in the passivation layer or organic material planarization layer. The specific materials of the passivation layer and the planarization layer are not limited. For example, the passivation layer may be made of silicon nitride, and the planarization layer may be made of resin.

Still as shown in FIG. 1, the display substrate further includes a plurality of common electrode lines 50 arranged on the same layer as the gate lines 10; each common electrode line 50 is located between two adjacent gate lines 10; for a pixel unit and a common electrode line 50 between any two adjacent gate lines 10, a pixel electrode 30 of the pixel unit covers the common electrode line 50; and for each pixel unit, the common electrode line 50 is a bottom electrode of a storage capacitor of the pixel unit, and the pixel electrode 30 is a top electrode of the storage capacitor of the pixel unit. In this case, the area of the storage capacitor of the pixel unit is the area of the overlapped part of the pixel electrode 30 and the common electrode line 50. The specific material of the common electrode line 50 is not limited. For example, the common electrode line 50 may be made of copper Cu, aluminum Al, molybdenum Mo, titanium Ti, chromium Cr, tungsten W, neodymium Nd, niobium Nb, or the like. The width of the common electrode line 50 is not limited, either. In this embodiment of the present disclosure, the width of the common electrode line 50 ranges from 2 microns to 30 microns.

Figure 3:
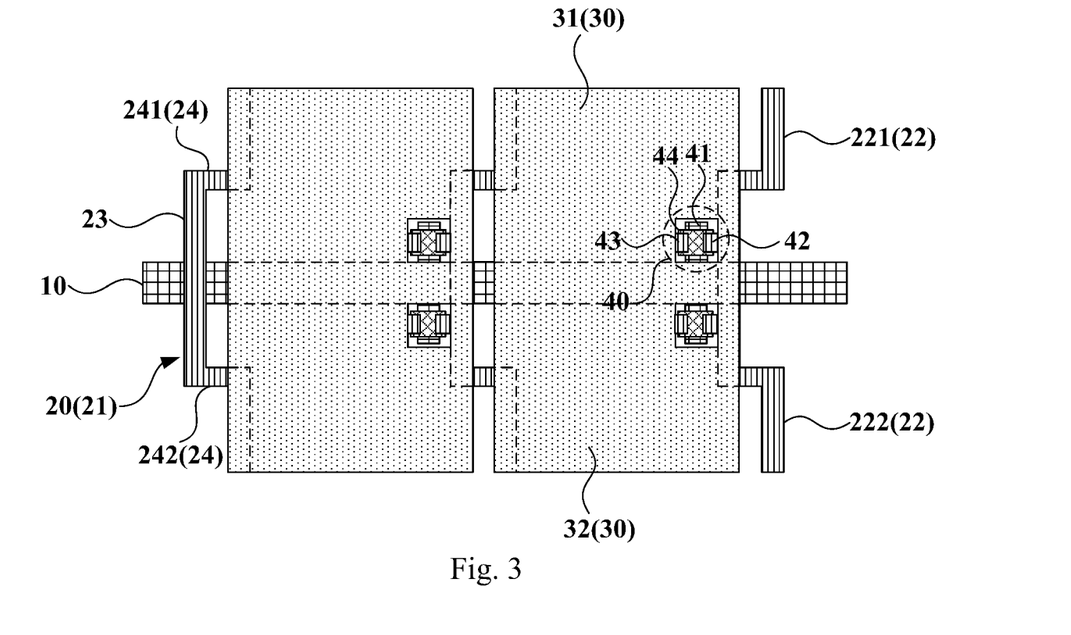
FIG. 3 is a schematic diagram of a local structure of a display substrate according to still another embodiment of the present disclosure.

As shown in FIG. 3, in another specific embodiments of the present disclosure, the first part 22 includes a first line segment 221 and a second line segment 222; the second part 23 is a single line; the connection part 24 includes a first connection part 241 and a second connection part 242; each data line part 21 includes a first line segment 221, a first connection part 241, a second part 23, a second connection part 242 and a second line segment 222 that are connected sequentially. In this case, each data line part 21 includes the first line segment 221, the first connection part 241, the second part 23, the second connection part 242 and the second line segment 222 that are five straight line segments. The first line segment 221 and the second line segment 222 may be arranged on the same straight line and may be parallel to the second part 23. The bent shape of the data line part 21 is not limited. In the embodiment shown in FIG. 3, pixel electrodes 30 of the pixel unit respectively cover a first part 22 of a data line part 21 on the left side of the pixel unit and a second part 23 of a data line part 21 on the right side of the pixel unit. In an embodiment shown in FIG. 4, pixel electrodes 30 of a pixel unit respectively cover a second part 23 of a data line part 21 on the left side of the pixel unit and a first part 22 of a data line part 21 on the right side of the pixel unit. In addition, optionally, the total length of the first line segment 221 and the second line segment 222 is the same as the length of the second part 23. Therefore, crosstalk caused by parasitic capacitance can be further reduced, and the display quality of the display device can be further improved.

Figure 4:
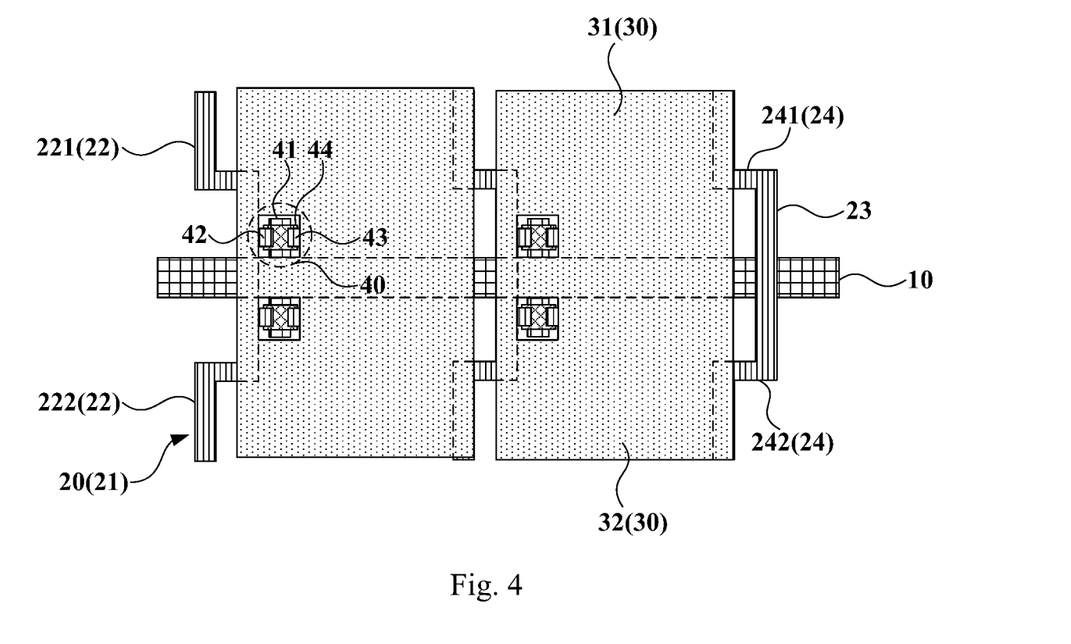
FIG. 4 is a schematic diagram of a local structure of a display substrate according to yet another embodiment of the present disclosure.

As shown in FIG. 3 and FIG. 4, each gate line 10 passes through a pixel area of each pixel unit in a row of pixel units corresponding to the gate line 10; the pixel area of each pixel unit is divided into a first sub-pixel area and a second sub-pixel area; and the pixel electrode 30 includes a first sub-pixel electrode 31 and a second sub-pixel electrode 32 that correspond to the first sub-pixel area and the second sub-pixel area respectively. The areas of the first sub-pixel area and the second sub-pixel area may be the same or different.

In an optional embodiment of the present disclosure, the first sub-pixel electrode 31 and the second sub-pixel electrode 32 adopt an integral structure covering the gate line 10.

Each pixel unit includes two thin film transistors 40, wherein gates 41 of the two thin film transistors 40 are connected to gate lines 10 corresponding to the pixel unit; sources 42 of the two thin film transistors 40 are respectively connected to data line parts 21 covered by pixel electrodes 30 of the pixel unit; and drains 43 of the two thin film transistors 40 are respectively connected to the first sub-pixel electrode 31 and the second sub-pixel electrode 32.

When a gate line 10 is located below a first part 22 of a data line part 21, the sources 42 of the two thin film transistors 40 are respectively connected to the first line segment 221 or the second line segment 222 of the data line part 21 that is located on one side of the pixel unit and that is covered by a pixel electrode 30 of the pixel unit; or when a gate line 10 is located below a second part 23 of a data line part 21, the sources 42 of the two thin film transistors 40 are respectively connected to the second part 23 of the data line part 21 that is located on the other side of the pixel unit and that is covered by a pixel electrode 30 of the pixel unit.

Optionally, for each pixel unit, the gate line 10 is a bottom electrode of a storage capacitor of the pixel unit, and the pixel electrode 30 is a top electrode of the storage capacitor of the pixel unit. In this case, the area of the storage capacitor of the pixel unit is the area of the overlapped part of the pixel electrode 30 and the gate line 10.

Figure 5:
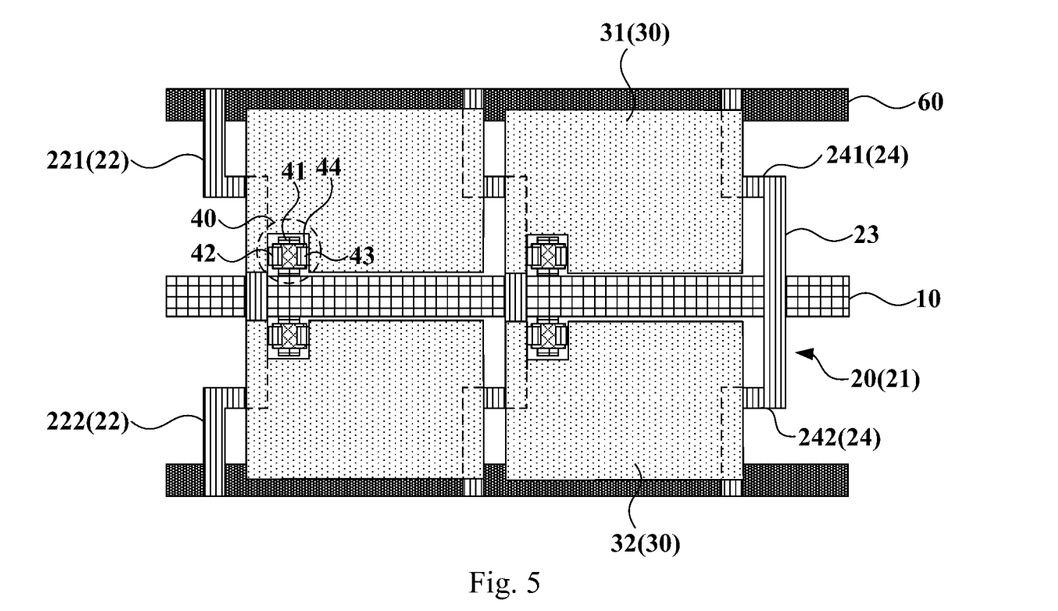
FIG. 5 is a schematic diagram of a local structure of a display substrate according to still yet another embodiment of the present disclosure.

As shown in FIG. 5, in another optional embodiment of the present disclosure, the first sub-pixel electrode 31 and the second sub-pixel electrode 32 are located on two sides of the gate line 10 in an insulated manner.

Each pixel unit includes two thin film transistors 40, wherein gates 41 of the two thin film transistors 40 are connected to gate lines 10 corresponding to the pixel unit; sources 42 of the two thin film transistors 40 are respectively connected to data line parts 21 covered by pixel electrodes 30 of the pixel unit; and drains 43 of the two thin film transistors 40 are respectively connected to the first sub-pixel electrode 31 and the second sub-pixel electrode 32.

According to the solution in this embodiment, the two thin film transistors 40 respectively control voltages of the first sub-pixel electrode 31 and the second sub-pixel electrode 32. Therefore, the voltages of the two sub-pixel electrodes can be adjusted as required according to the areas of the first sub-pixel electrode 31 and the second sub-pixel electrode 32, to control the color brightness of the first sub-pixel area and the second sub-pixel area of the pixel unit, and enhance the saturation of displayed colors. This is beneficial to the design of a display device with large size, high resolution and high refresh rate.

In the embodiment shown in FIG. 5, the display substrate further includes a group of common electrode lines arranged on the same layer as the gate line 10; the group of common electrode lines includes a plurality of first common electrode lines 60; and the pixel units are defined by the plurality of first common electrode lines 60 and a plurality of data lines 20 that cross each other.

Optionally, for a pixel unit between any two adjacent first common electrode lines 60, pixel electrodes 30 of the pixel unit respectively cover side parts, near the pixel unit, of the two first common electrode lines 60; and for each pixel unit, the side parts of the two first common electrode lines 60 are bottom electrodes of a storage capacitor of the pixel unit, and the pixel electrodes 30 are top electrodes of the storage capacitor of the pixel unit. In this case, the area of the storage capacitor of the pixel unit is the area of the overlapped part of the pixel electrode 30 and two first common electrode lines 60 on two sides of the pixel unit.

Figure 6:
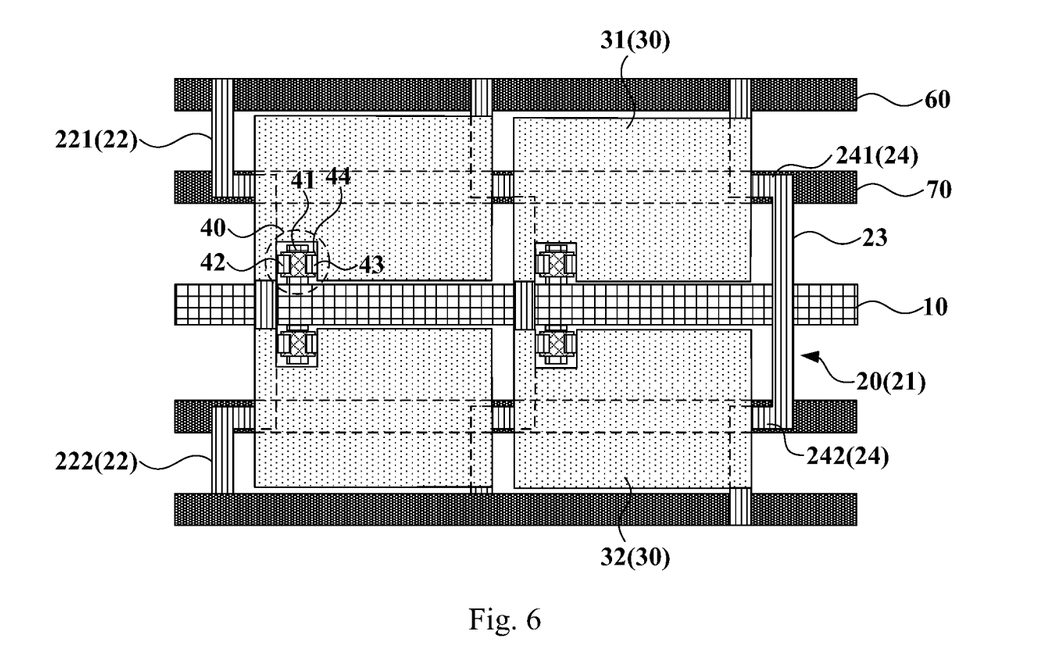
FIG. 6 is a schematic diagram of a local structure of a display substrate according to a further embodiment of the present disclosure.
Figure 7:
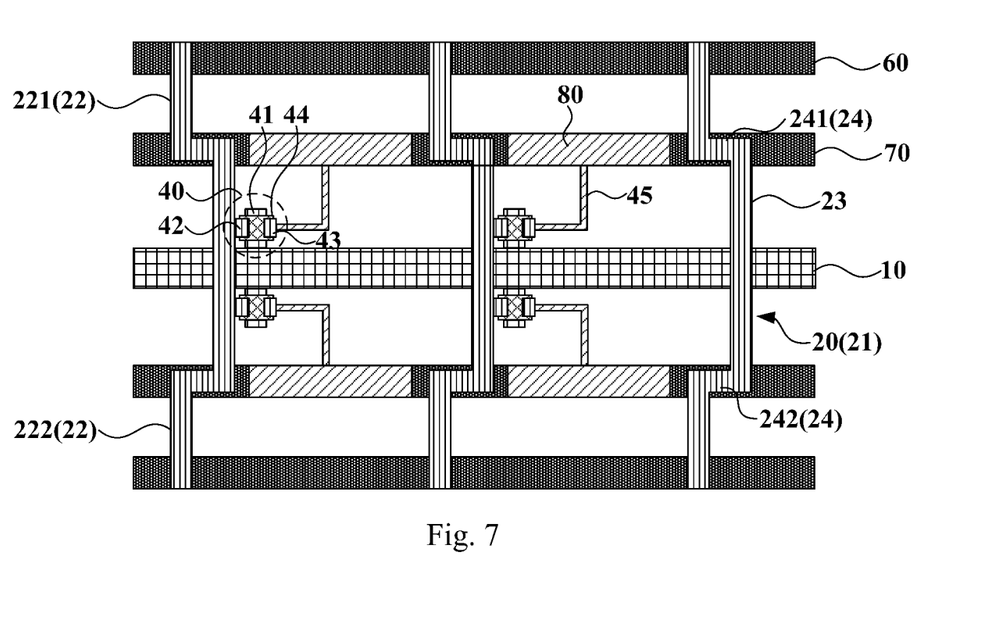
FIG. 7 is a schematic diagram of another local structure of the display substrate according to the embodiment shown in FIG. 6.

In the embodiments shown in FIG. 6 and FIG. 7, optionally, the group of common electrode lines further includes a plurality of second common electrode lines 70; each second common electrode line 70 is located between a first common electrode line 60 and a gate line 10 that are adjacent to each other; and for a pixel unit between any two adjacent first common electrode lines 60, the first sub-pixel electrode 31 and the second sub-pixel electrode 32 of the pixel unit respectively cover corresponding second common electrode lines 70.

The display substrate further includes a metal wiring 80 arranged on the same layer as the drain 43 of the thin film transistor 40 and connected with the drain 43 through a drain lead 45; the metal wiring 80 is located above the second common electrode line 70; and for each pixel unit, the second common electrode line 70 is a bottom electrode of a storage capacitor of the pixel unit, and the metal wiring 80 is a top electrode of the storage capacitor of the pixel unit.

In this case, the area of the storage capacitor of the pixel unit is the area of the overlapped part of the metal wiring 80 and the second common electrode line 70. Certainly, the first sub-pixel electrode 31 and the second sub-pixel electrode 32 of the pixel unit may respectively cover side parts of first common electrode lines 60 on two sides of the pixel unit. Therefore, the area of the storage capacitor of the pixel unit can be further enlarged. In the solution in this embodiment, the display panel may include two metal wirings 80 connected to drains 43 of two thin film transistors 40 of the pixel unit through drain leads 45. It may be understood that the two metal wirings 80 are located in the first sub-pixel area and the second sub-pixel area of the pixel unit, and are respectively opposite to the second common electrode lines 70 in the first sub-pixel area and the second sub-pixel area. According to the solution, the first sub-pixel electrode 31 and the second sub-pixel electrode 32 may be connected to the metal wirings 80 through via holes formed in a passivation layer or an organic material planarization layer, so as to be connected to the drains 43 of the thin film transistors 40.

It should be noted that, in the embodiments shown in FIG. 5 to FIG. 7, the first sub-pixel electrode 31 and the second sub-pixel electrode 32 may alternatively adopt an integral structure covering the gate line 10. In this case, for the embodiment shown in FIG. 5, the area of the storage capacitor of the pixel unit includes the area of the overlapped part of the pixel electrode 30 and two first common electrode lines 60 on two sides of the pixel unit and the area of the overlapped part of the pixel electrode 30 and the gate line 10; and for the embodiments shown in FIG. 6 and FIG. 7, the area of the storage capacitor of the pixel unit includes the area of the overlapped part of the metal wiring 80 and the second common electrode line 70 and the area of the overlapped part of the pixel electrode 30 and the gate line 10.

An embodiment of the present disclosure further provides a display panel, including the display substrate according to any one of the foregoing technical solutions. It may be understood that the display panel further includes an opposite-side substrate that can cover the display substrate. A black matrix is arranged at a position, corresponding to the connection part of the data line, on the opposite-side substrate, to avoid light leakage at the position. The pixel aperture ratio of the display panel is greatly increased, and crosstalk caused by parasitic capacitance can be effectively suppressed. Therefore, the display quality is better.

An embodiment of the present disclosure further provides a display device, including the display panel according to the foregoing technical solution. The aperture ratio of the display device is greatly increased, and the display quality is also improved.

Apparently, a person skilled in the art can make various changes and modifications of the present disclosure without departing from the spirit and scope of the present disclosure. Thus, the present disclosure is intended to include these modifications and the modifications, provided that they belong to the scope of the claims and equivalent technologies of the present disclosure.

The invention claimed is:

1. A display substrate, comprising a substrate, a plurality of pixel units on the substrate in a form of an array, gate lines that are in one-to-one correspondence to each row of pixel units, and data lines between any two adjacent columns of pixel units, wherein,
   each of the pixel units comprises a pixel electrode and a thin film transistor configured to control the pixel electrode; and
   each of the data lines comprises a plurality of curved data line parts between any two pixel units, whose row directions are adjacent to each other, in two columns of pixel units on two sides of the data line, wherein each data line part comprises a first part covered by a pixel electrode of a pixel unit on one side of the data line part and a second part covered by a pixel electrode of a pixel unit on the other side of the data line part;
   wherein each data line part further comprises a connection part configured to connect the first part with the second part;
   wherein the first part comprises a first line segment and a second line segment the second part is a single line; the connection part comprises a first connection part and a second connection part; each data line part comprises a first line segment, a first connection part, a second part, a second connection part and a second line segment that are connected sequentially;
   wherein each gate line passes through a pixel area of each pixel unit in a row of pixel units corresponding to the gate line; the pixel area of each pixel unit is divided into a first sub-pixel area and a second sub-pixel area; and the pixel electrode comprises a first sub-pixel electrode and a second sub-pixel electrode that correspond to the first sub-pixel area and the second sub-pixel area respectively;
   wherein the first sub-pixel electrode and the second sub-pixel electrode are on two sides of the gate line in an insulated manner; and
each pixel unit comprises two thin film transistors, wherein gates of the two thin film transistors are connected to gate lines corresponding to the pixel unit sources of the two thin film transistors are respectively connected to data line parts covered by pixel electrodes of the pixel unit and drains of the two thin film transistors are respectively connected to the first sub-pixel electrode and the second sub-pixel electrode;
   wherein the display substrate further comprises a group of common electrode lines, and the group of common electrode lines comprises a plurality of first common electrode lines;
wherein the group of common electrode lines further comprises a plurality of second common electrode lines; each second common electrode line is between a first common electrode line and a gate line that are adjacent to each other; and for a pixel unit between any two adjacent first common electrode lines, the first sub-pixel electrode and the second sub-pixel electrode of the pixel unit respectively cover corresponding second common electrode lines; and
   the display substrate further comprises a metal wiring arranged on a layer same as a layer where the drain of the thin film transistor is, and connected with the drain through a drain lead; the metal wiring is above the second common electrode line; and for each pixel unit, the second common electrode line is a bottom electrode of a storage capacitor of the pixel unit, and the metal wiring is a top electrode of the storage capacitor of the pixel unit.

2. The display substrate according to claim 1, wherein the first part and the second part are single lines, and each data line part comprises a first part, a connection part, and a second part that are connected sequentially.

3. The display substrate according to claim 2, wherein the pixel units are defined by a plurality of gate lines and a plurality of data lines that cross each other; and
   each pixel unit comprises a thin film transistor, wherein a gate of the thin film transistor is connected to a gate line corresponding to the pixel unit, a source of the thin film transistor is connected to a data line part covered by a pixel electrode of the pixel unit, and a drain of the thin film transistor is connected to the pixel electrode of the pixel unit.

4. The display substrate according to claim 3, further comprises a plurality of common electrode lines on a layer same as a layer where the gate lines are; each of the common electrode lines is between two adjacent gate lines; for a pixel unit and a common electrode line between any two adjacent gate lines, a pixel electrode of the pixel unit covers the common electrode line; and for each pixel unit, the common electrode line is a bottom electrode of a storage capacitor of the pixel unit, and the pixel electrode is a top electrode of the storage capacitor of the pixel unit.

5. The display substrate according to claim 1, wherein the group of common electrode lines arranged on a layer same as a layer where the gate line is; and the pixel units are defined by the plurality of first common electrode lines and a plurality of data lines that cross each other.

6. The display substrate according to claim 5, wherein for a pixel unit between any two adjacent first common electrode lines, pixel electrodes of the pixel unit respectively cover side parts, near the pixel unit, of the two first common electrode lines; and for each pixel unit, the side parts of the two first common electrode lines are bottom electrodes of a storage capacitor of the pixel unit, and the pixel electrodes are top electrodes of the storage capacitor of the pixel unit.

7. A display panel, comprising the display substrate according to claim 1.

8. A display device, comprising the display panel according to claim 7.

9. The display panel according to claim 1, wherein the first part and the second part are single lines, and each data line part comprises a first part, a connection part, and a second part that are connected sequentially.

10. The display panel according to claim 9, wherein the pixel units are defined by a plurality of gate lines and a plurality of data lines that cross each other; and
   each pixel unit comprises a thin film transistor, wherein a gate of the thin film transistor is connected to a gate line corresponding to the pixel unit, a source of the thin film transistor is connected to a data line part covered by a pixel electrode of the pixel unit, and a drain of the thin film transistor is connected to the pixel electrode of the pixel unit.

11. The display panel according to claim 10, wherein the display substrate further comprises a plurality of common electrode lines on a layer same as a layer where the gate lines are; each of the common electrode lines is between two adjacent gate lines; for a pixel unit and a common electrode line between any two adjacent gate lines, a pixel electrode of the pixel unit covers the common electrode line; and for each pixel unit, the common electrode line is a bottom electrode of a storage capacitor of the pixel unit, and the pixel electrode is a top electrode of the storage capacitor of the pixel unit.

* * * * *